US006327464B1

United States Patent
Hayasaka

(10) Patent No.: US 6,327,464 B1
(45) Date of Patent: Dec. 4, 2001

(54) FREQUENCY CONVERSION CIRCUIT HAVING A VARIABLE TRAP CIRCUIT TUNED TO THE LOCAL OSCILLATOR FREQUENCY

(75) Inventor: Kenichi Hayasaka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/587,349

(22) Filed: Jun. 5, 2000

(30) Foreign Application Priority Data

Jun. 7, 1999 (JP) .................................... 11-160256

(51) Int. Cl.[7] .................. H04B 1/10; H04B 1/18
(52) U.S. Cl. ............... 455/286; 455/317; 455/192.1; 455/192.2
(58) Field of Search ........................ 455/286, 195, 455/192, 195.1, 192.1, 192.2, 192.3, 317

(56) References Cited

U.S. PATENT DOCUMENTS

| 4,215,372 | * | 7/1980 | Suzuki | 358/188 |
| 4,849,721 | * | 7/1989 | Matsuura | 333/174 |
| 5,991,609 | * | 11/1999 | Marrah | 455/182.2 |
| 6,031,878 | * | 2/2000 | Tomasz | 375/316 |

FOREIGN PATENT DOCUMENTS

| 59-112784 | 6/1984 | (JP) . |
| 59-188242 | 10/1984 | (JP) . |
| 62-278820 | 12/1987 | (JP) . |
| 2-302113 | 12/1990 | (JP) . |
| 4-72728 | 6/1992 | (JP) . |
| 9-74362 | 3/1997 | (JP) . |

* cited by examiner

*Primary Examiner*—Vivian Chang
*Assistant Examiner*—James K Moore
(74) *Attorney, Agent, or Firm*—Ostrolenk, Faber, Gerb & Soffen, LLP

(57) ABSTRACT

A frequency converting circuit which reduces the amount of leakage of oscillating signals to the output, includes a local oscillator; a mixer for mixing the input signal with the output of the local oscillator, and a variable trap circuit connected in the output of the mixer. The local oscillator includes a PLL circuit, and a tank circuit having a coil and a varactor diode whose capacity is controlled by the PLL circuit. The variable trap circuit also includes a coil and a varactor diode, and is controlled by the PLL circuit to resonate at an output frequency of the local oscillator.

2 Claims, 5 Drawing Sheets

FREQUENCY CONVERSION CIRCUIT HAVING A VARIABLE TRAP CIRCUIT TUNED TO THE LOCAL OSCILLATOR FREQUENCY

BACKGROUND OF THE INVENTION

1. Field of the Invention

The present invention relates to a frequency converting circuit comprising a PLL (Phase-Locked Loop) circuit, and, in particular, relates to a damping circuit for locally oscillated electric signals.

This application is based on Patent Application No. Hei 11-160256 filed in Japan, the contents of which are incorporated herein by reference.

2. Background Art

It is general practice to convert input signals mixed with signals which are generated by a locally oscillating circuit (hereinafter, the abbreviation "OSC" indicates oscillating) into output signals with a predetermined frequency. A frequency converting circuit ideally outputs signals with only output frequency, however in practice, output signals contain leaked components originating from the input signals or the OSC signals. It is required that the amount of signal leakage be reduced to as low as possible since the output signals can be undesirably affected if the leaked components from the input signals or the OSC signals are excessive. Furthermore, in the case of a frequency converting circuit comprising a known double-balanced mixing circuit, the leaked components from the OSC signals are greater than the ones from the input signals, and the leaked components must be reduced.

In order to meet the above requirements, a circuit, shown in FIG. 5, for example, has been proposed. In this circuit, a signal being input from a terminal 51 and the OSC signal being output from the OSC circuit 54, which is controlled by a PLL circuit 57 fed by a buffer amplifier 56, are mixed in a mixer 55, then a differential frequency is derived. The derived signals are amplified by buffer amplifier 58 passed from terminal 52 through a capacitor 59, a filter 60 (such as a band-pass filter or a low-pass filter) and a further capacitor 61 in order to eliminate undesired leak signals, so that only necessary output signals can be obtained at terminal 53.

SUMMARY OF THE INVENTION

The method described above, however, has some drawbacks when the output signal has relatively low frequency or the output frequency and the OSC frequency are too close to each other. If the output frequency is relatively low, the inductance of the coil and the capacitance of the capacitor must be increased in order to construct a filter through which low frequency signals pass. A coil of a large size will be necessary when relatively high inductance is to be achieved. If the capacitance of the capacitor is increased, the Q-factor of the filter will be improved, while in contrast, the gain at the resonant frequency will be lowered.

It is required that the Q-factor of the filter be improved in order to reduce the OSC leak amount when the output frequency and the OSC frequency are close to each other, however this leads to an undesired loss of gain.

Another method to separate output signals from OSC signals whose frequency is close to the output frequency is to use a crystal filter, however, a drawback with this is that crystal filters are expensive. Another method is to connect a trap filter whose resonant frequency is fixed. A drawback of this method is that the trap filter is effective only at its resonant frequency.

It is therefore an object of the present invention to resolve the aforementioned drawbacks of the prior art by providing a signal frequency converting circuit which is capable of reducing the amount of leakage of OSC signal to the output signals.

According to one aspect of the invention, there is provided a signal frequency converting circuit comprising a local oscillator; a mixer for mixing output signals from the local oscillator and input signals and consequently generating a signal with a differential frequency between both signals; and a variable trap circuit connected to the output line of the mixer for reducing undesired signals leaked into the signal with the differential frequency.

According to another aspect of the invention, there is provided a signal frequency converting circuit according to the first aspect further comprising a PLL circuit, wherein the variable trap circuit comprises a coil; and a varactor diode; and wherein the variable trap circuit resonates at the output frequency of the local oscillator by means of controlling the capacity of the varactor diode by the PLL circuit, and traps the undersigned signals having a frequency close to the output frequency.

According the present invention, the amount of leakage of the OSC signal to the output signal can be reduced as a result of inserting a variable trap circuit comprising a coil and a varactor diode in the output line of the signal frequency converting circuit having a PLL circuit. A controlling voltage, output from the PLL circuit to control the OSC frequency in the signal frequency converting circuit, is used to define the resonant frequency of the variable trap circuit.

Referring now to FIG. 1, a variable trap circuit 37 having a coil 31 and a varactor diode 32 is connected in the output line of the frequency converting circuit 11 including a PLL circuit 14. The coil 31 and the varactor diode 32 are so selected that undesired signals in the OSC signals 42 can be effectively trapped. The OSC signals 42 are generated by a coil 18 and a varactor diode 19 which consist of a tank circuit 17 in the frequency converting circuit 11.

A voltage, output from the PLL circuit 14 to control the OSC frequency 42 in the signal frequency converting circuit 11 and given to the tank circuit 17, is used to define the resonant frequency of the variable trap circuit 37. The variable trap circuit 37 is therefore a filter consistently having a trap effect around the frequency of the OSC signal, with which leaked components from the OSC signal 42 included in the output signals of the frequency converting circuit 11 can be reduced.

DETAILED DESCRIPTION OF THE PREFERRED EMBODIMENTS

A preferred embodiment of the signal frequency converting circuit according to the present invention will be explained hereinafter with reference to the drawings.

Figure 1:
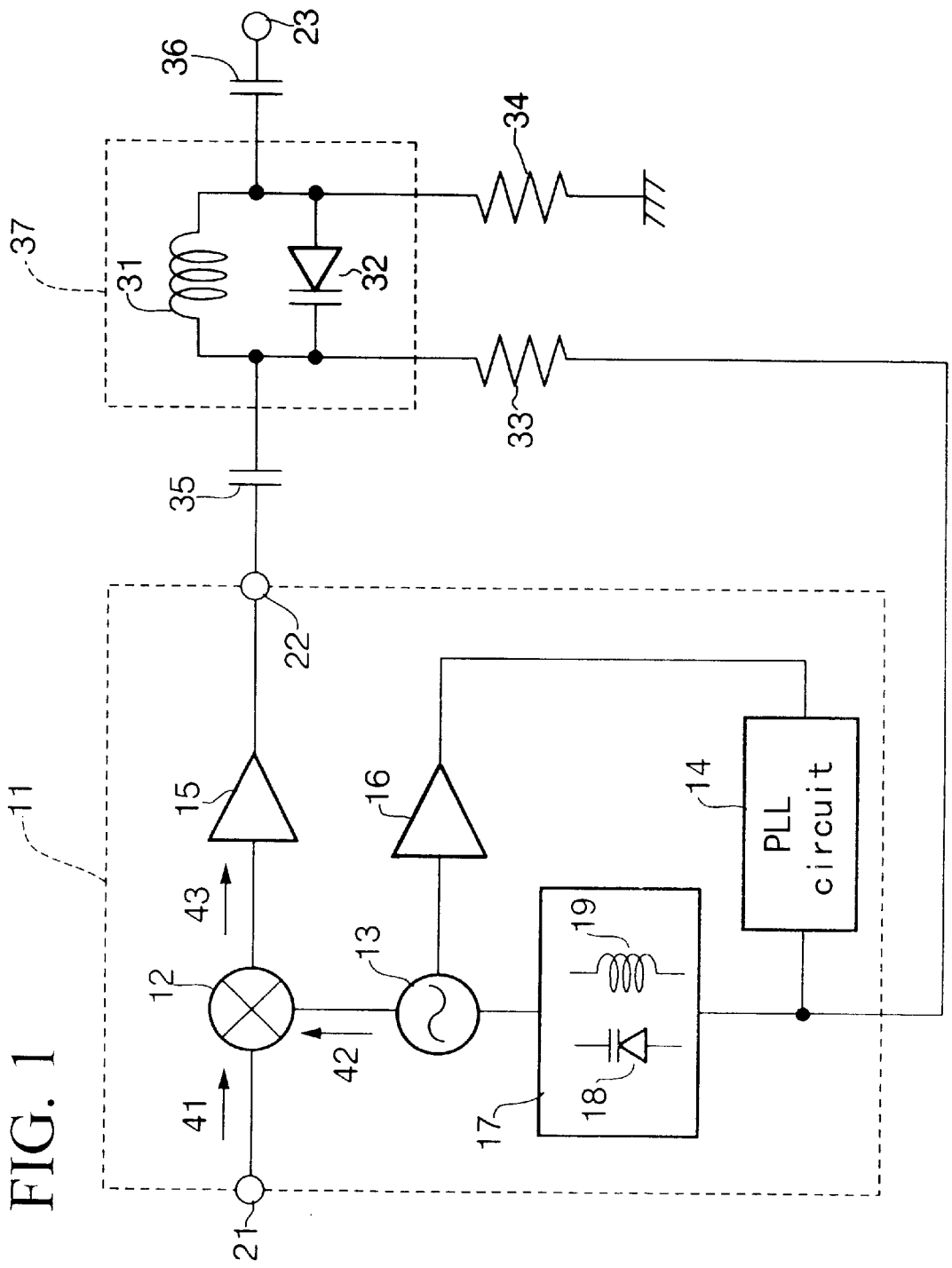
FIG. 1 is a block diagram showing a preferred embodiment of the signal frequency converting circuit according to the present invention.

FIG. 1 is a block diagram showing a preferred embodiment of the signal frequency converting circuit according to the present invention. As shown in FIG. 1, the signal frequency converting circuit 11 comprises a mixer 12, an OSC circuit 13, a PLL circuit 14, buffer amplifiers 15 and 16, and a tank circuit 17 including a varactor diode 18 and a coil 19, for generating OSC signals.

The mixer 12 mixes a signal 41 being input to an input terminal 21 and an OSC signal 42 being generated by the tank circuit 17 connected to the OSC circuit 13, then outputs a signal 43 having frequency components equal to the differential frequency between the signal 41 and the OSC signal 42. The OSC signal generated by the tank circuit 17 is kept constant by means of PLL circuit 14. The output signal 43 from the mixer 12 and the OSC signal 42 are amplified by means of the buffer amplifiers 15 and 16, respectively.

The output terminal 22 of the frequency converting circuit 11 and the variable trap circuit 37 comprising the coil 31 and the varactor diode 32 are connected by means of a connecting capacitor 35. The output line of the variable trap circuit 37 and an output terminal 23 are connected by means of another connecting capacitor 36, in turn. A controlling voltage from PLL circuit 14 is applied to the tank circuit 17 in order to control the capacity of the varactor diode. The controlling voltage from the PLL circuit is also applied, via a biasing resistor 33, to the cathode of the varactor diode 32 which is included in the variable trap circuit 37. The anode of the varactor diode 32 is grounded via another biasing resistor 34. The coil 31 and the varactor diode 32 included in the variable trap circuit 37 are so selected that they appropriately match the frequency of the OSC signal generated by the tank circuit 17.

The operation of the signal frequency converting circuit according to this embodiment is as follows.

The following equation is formed in the frequency converting circuit 11.

$$f_{OUT}=|f_{OSC}-f_{IN}|$$

where $f_{IN}$ is the frequency of the signal 41 being input from the input terminal 21, $f_{OSC}$ is the frequency of the OSC signal 42 generated by the OSC circuit 13 and the tank circuit 17, and $f_{out}$ is the frequency of the signal 43 being output from the terminal 22.

The $f_{OSC}$ varies depending on the changing $f_{IN}$, and the $f_{OUT}$ is generally constant.

It is desirable that only a signal with the frequency $f_{OUT}$ be observed at the output terminal 22, however in practice, leaked components from the input signal with the frequency $f_{IN}$ and from the OSC signal with the frequency $f_{OSC}$ are also output. In general, the amount of leakage of the OSC signal with the frequency $f_{OSC}$ is greater than that of the input signal with the frequency $f_{IN}$. According to the present invention, the controlling voltage applied to the tank circuit from the PLL circuit is also used to control a trap frequency of the variable trap circuit 37, so that the trap frequency is always same as the OSC frequency, as a result of which, the leaked components from the OSC signal at the output terminal 22 can be reduced.

Figure 2:
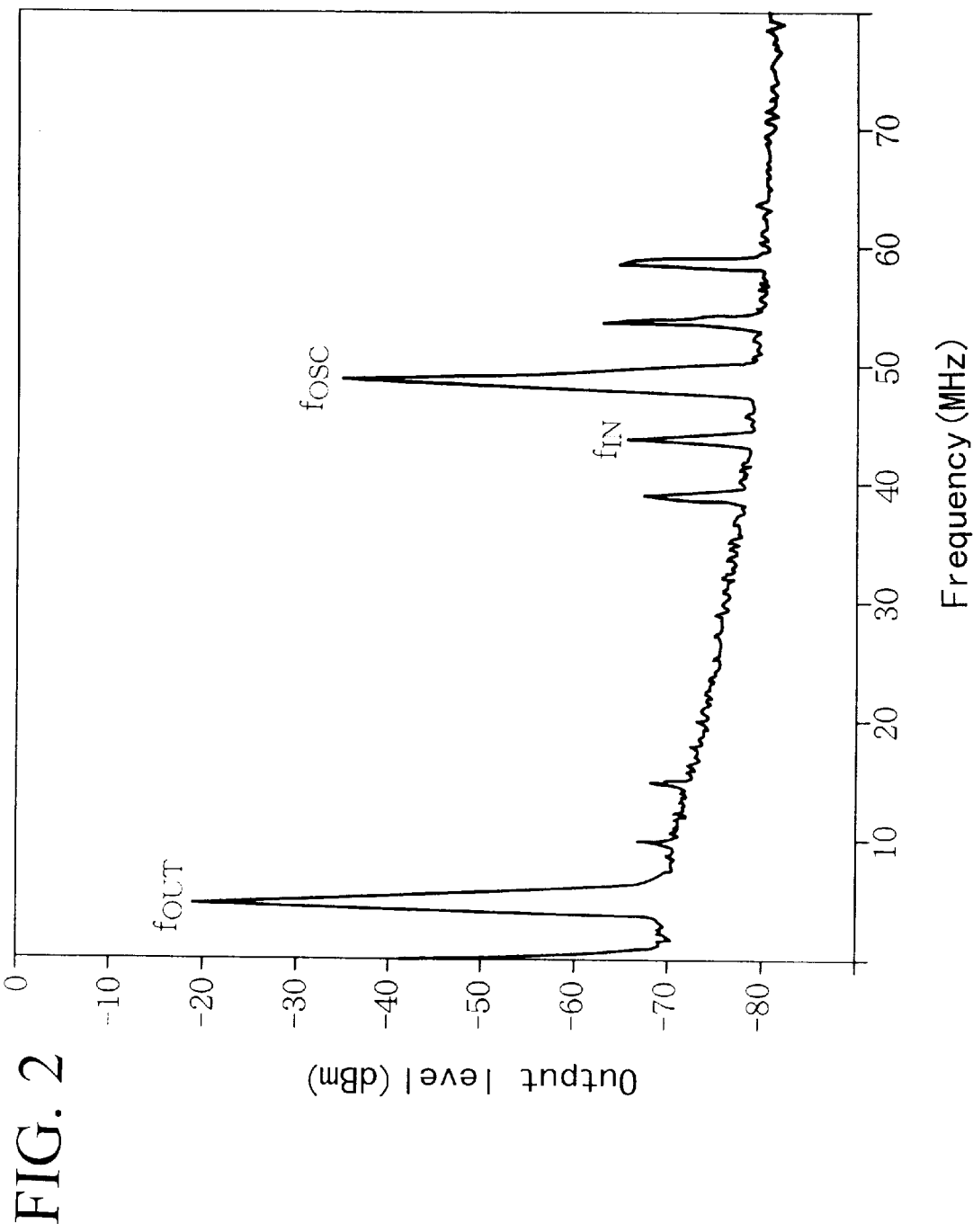
FIG. 2 is a graph showing the frequency characteristic of the output signal from the mixer included in FIG. 1.
Figure 3:
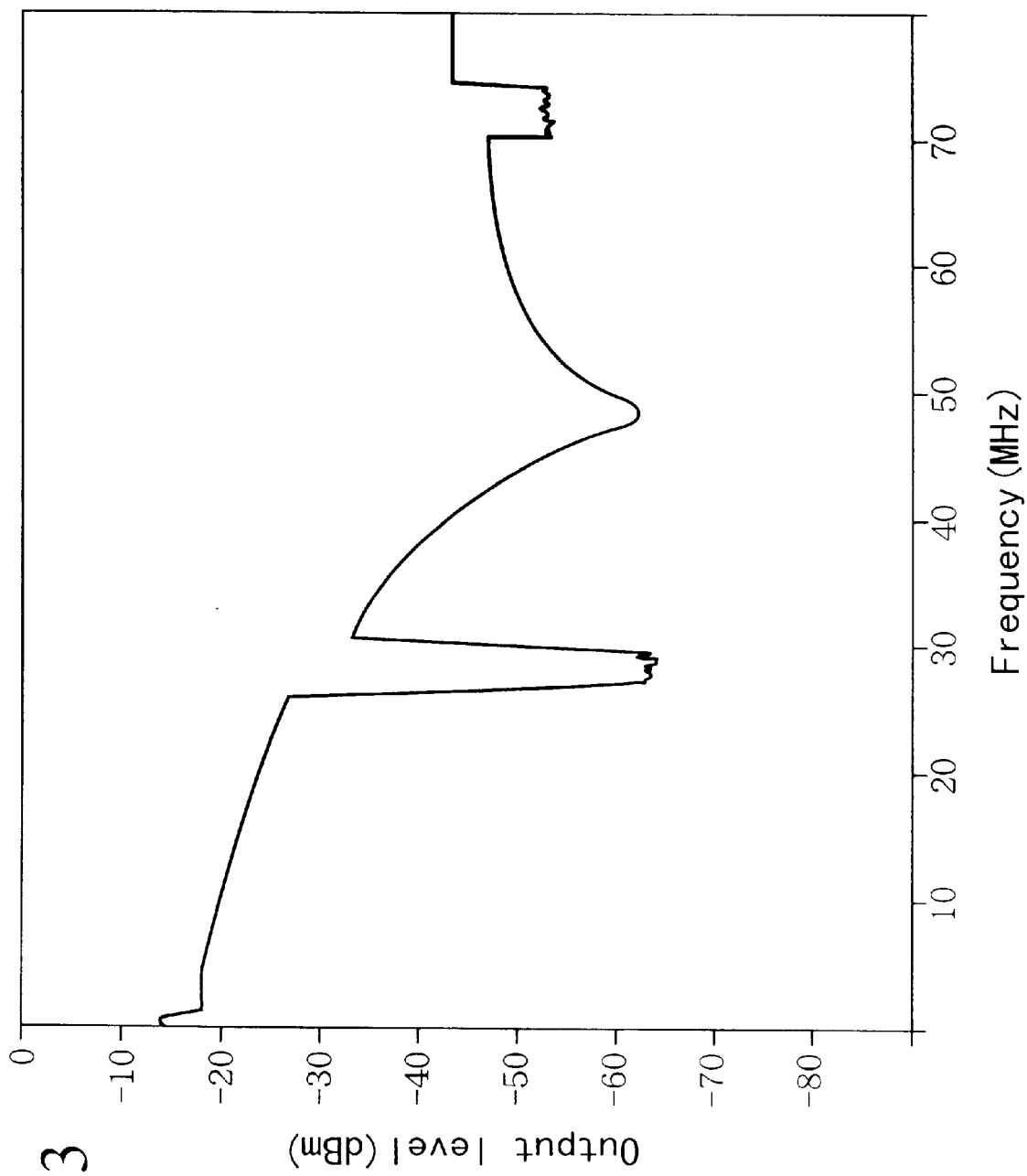
FIG. 3 is a graph showing the frequency characteristic of the variable trap circuit included in FIG. 1.
Figure 4:
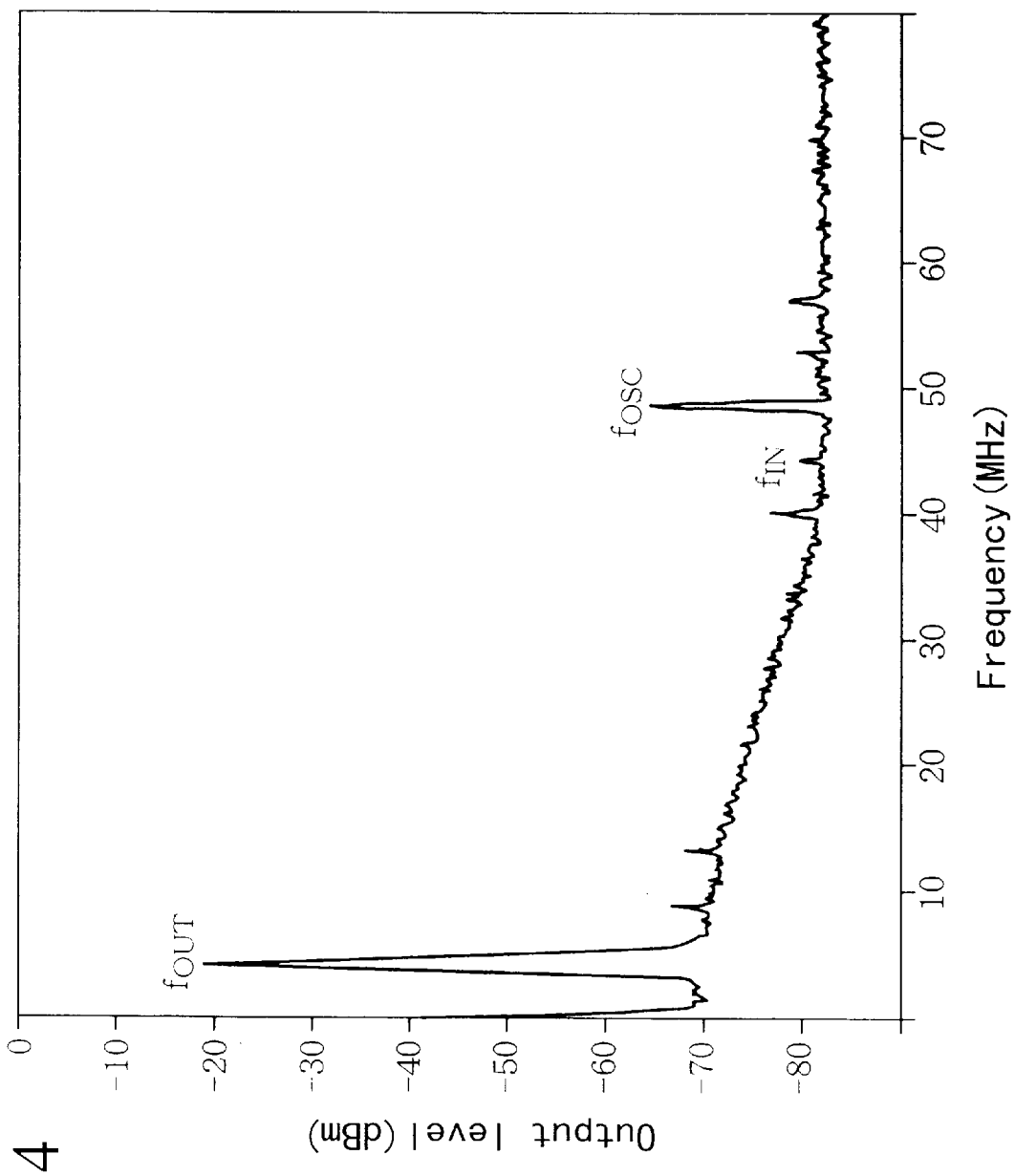
FIG. 4 is a graph showing the frequency characteristic of the preferred embodiment of the signal frequency converting circuit according to the present invention
Figure 5:
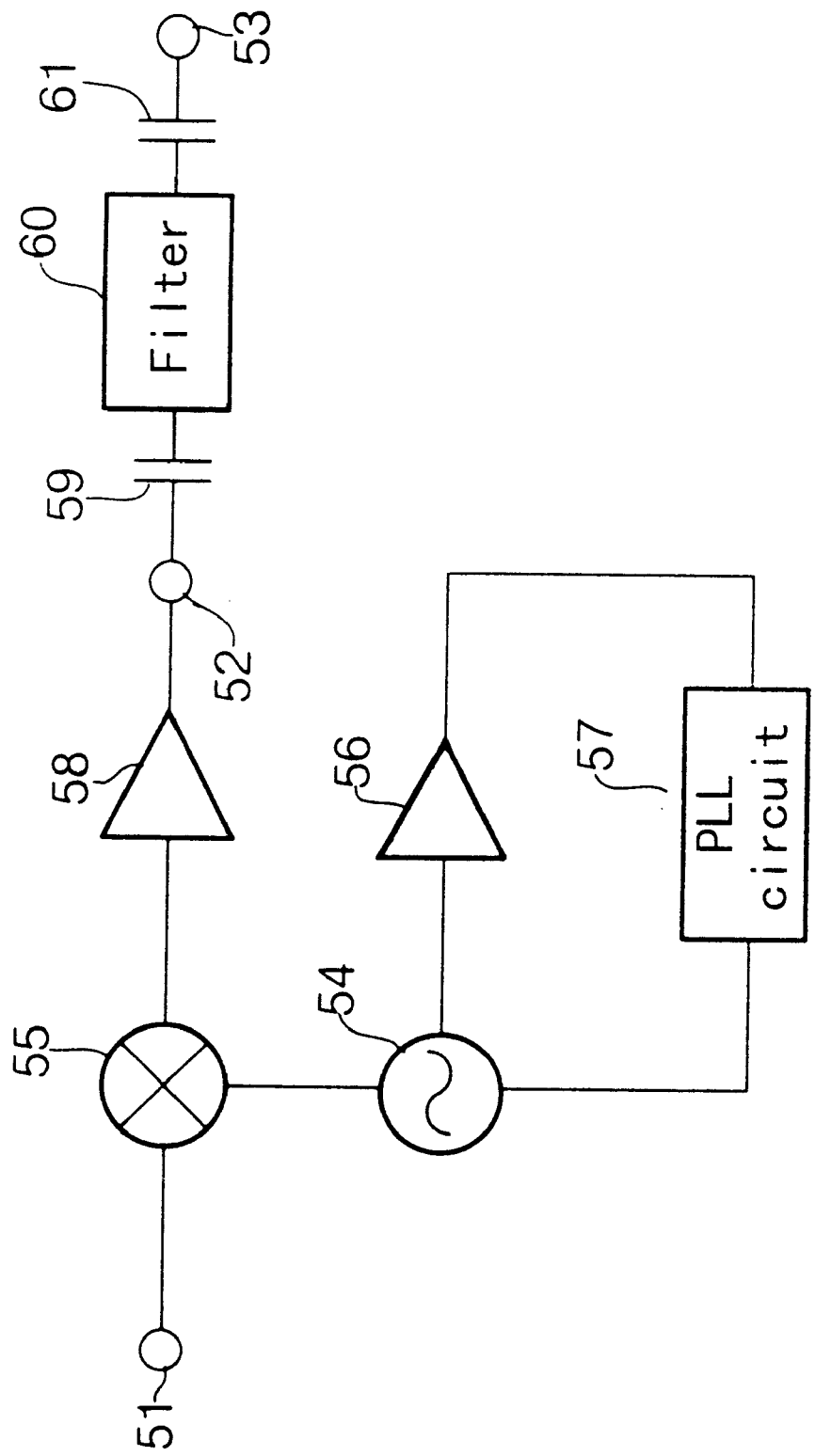
FIG. 5 is a block diagram showing a conventional signal frequency converting circuit.

FIG. 2 to FIG. 4 show the operating characteristics of local points. FIG. 2 shows the frequency characteristic of the output signal 43 from the mixer 12. FIG. 3 shows the frequency characteristic of the variable trap circuit 37. FIG. 4 shows the frequency characteristic of the output signal of the variable trap circuit 37 receiving the signal characterized according to FIG. 2.

As shown in FIG. 2, $f_{OUT}/f_{OSC}$ is about 15 dBc at the output terminal 22 below the mixer 12, whereas $f_{OUT}/f_{OSC}$ is more than 40 dBc, as shown in FIG. 4, after passing the variable trap circuit 37, which means that the variable trap circuit 37 has a significant trap effect.

The detailed operation of the preferred embodiment according to the present invention has been described with reference to the drawings hereinbefore, however, the present invention is not limited to this embodiment but all variants which do not depart from the spirit of the present invention also fall within the scope of the present invention As described above, according to the present invention, it is possible to greatly reduce the amount of the leakage of the signal originating from the OSC signal and included in the output signal of the frequency converting circuit since the output signal comes out via the trap circuit which has been adjusted in accordance with the OSC signal.

What is claimed is:

1. A signal frequency converting circuit comprising:

a local oscillator;

a mixer for mixing output signals from said local oscillator and input signals and consequently generating a signal with a differential frequency between both of said signals;

a variable trap circuit connected to the output line of said mixer for reducing undesired signals leaked into the signal with the differential frequency; and a PLL circuit, wherein said variable trap circuit comprises:
a coil; and
a varactor diode;

wherein said variable trap circuit resonates at an output frequency of the local oscillator by means of controlling a capacity of said varactor diode by the PLL circuit, and traps the undesired signals having a frequency close to the output frequency.

2. A signal frequency converting circuit comprising:

a local oscillator;

a mixer for mixing output signals from said local oscillator and input signals and consequently generating a signal with a differential frequency between both of said signals;

a variable trap circuit connected to the output line of said mixer for reducing undesired signals leaked into the signal with the differential frequency; and a PLL circuit; and a tank circuit connected between the local oscillator and the PLL circuit and having a coil and a varactor diode whose capacity is controlled by the output signal from said PLL circuit, wherein said variable trap circuit comprises a coil and a varactor diode, resonates at the output frequency of the local oscillator by means of controlling a capacity of said varactor diode by the PLL circuit, and traps the undesired signals having a frequency close to the output frequency.

* * * * *